(12) United States Patent
Aguado Granados et al.

(10) Patent No.: US 7,989,337 B2
(45) Date of Patent: Aug. 2, 2011

(54) IMPLEMENTING VERTICAL AIRGAP STRUCTURES BETWEEN CHIP METAL LAYERS

(75) Inventors: Axel Aguado Granados, Rochester, MN (US); Benjamin Aaron Fox, Rochester, MN (US); Nathaniel James Gibbs, Rochester, MN (US); Andrew Benson Maki, Rochester, MN (US); Trevor Joseph Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 12/430,300

(22) Filed: Apr. 27, 2009

(65) Prior Publication Data

US 2010/0270682 A1 Oct. 28, 2010

(51) Int. Cl.
*H01L 21/4763* (2006.01)

(52) U.S. Cl. .................................. 438/619

(58) Field of Classification Search ............ None
See application file for complete search history.

(56) References Cited

U.S. PATENT DOCUMENTS

| | | | | |
|---|---|---|---|---|
| 5,461,003 A | * | 10/1995 | Havemann et al. | 438/666 |
| 7,056,822 B1 | * | 6/2006 | Zhao | 438/619 |
| 7,407,826 B2 | * | 8/2008 | Jafri et al. | 438/48 |

* cited by examiner

*Primary Examiner* — Charles D Garber
*Assistant Examiner* — Andre' C Stevenson
(74) *Attorney, Agent, or Firm* — Joan Pennington

(57) ABSTRACT

A method and structure are provided for implementing vertical airgap structures between chip metal layers. A first metal layer is formed. A first layer of silicon dioxide dielectric is deposited onto the first metal layer. A vertical air gap is etched from the first layer of silicon dioxide dielectric above the first metal layer. A second layer of silicon dioxide dielectric is deposited and the vertical air gap is sealed. A next trace layer is etched from the second layer of silicon dioxide dielectric and a via opening is etched from the second and first layers of silicon dioxide dielectric. Then metal is deposited into the next trace layer and metal is deposited into the via opening.

18 Claims, 3 Drawing Sheets

200

LOWER LAYER OF METAL 202

210

FIRST LAYER 212 OF SiO$_2$ DEPOSITION

VERTICAL AIRGAP 214 ETCHED

220

SECOND LAYER 222 OF SiO$_2$ DEPOSITION,

AIRGAP 214 VACUUM SEALED

230

NEXT TRACE LAYER 232 FOR METAL ETCHED

VIA OPENING 234 ETCHED

240

NEXT METAL LAYER 242 DEPOSITED AND VIA METAL DEPOSITED

VERTICAL AIRGAP 214 REDUCES CAPACITANCE TO NEXT LAYER OF METAL

US 7,989,337 B2

IMPLEMENTING VERTICAL AIRGAP STRUCTURES BETWEEN CHIP METAL LAYERS

FIELD OF THE INVENTION

The present invention relates generally to the field of manufacturing semiconductor devices, and more particularly, relates to a method and apparatus for implementing vertical airgap structures between chip metal layers.

DESCRIPTION OF THE RELATED ART

To improve the chip performance through the back end of line (BEOL) process, IBM created the Airgap BEOL technology to reduce capacitance and improve timing of signals through on-chip wiring. In general, the Airgap BEOL technology currently is implemented on a per metal layer basis and is placed between adjacent co-planar traces.

In general, the BEOL process includes the semiconductor device fabrication process where active components, such as transistors, resistors, and the like are interconnected with wiring on the wafer. BEOL generally begins when the first layer of metal is deposited on the wafer and includes the fabrication process for contacts, insulator, metal levels, and bonding sites for chip-to-package connections. Dicing the wafer into individual integrated circuit chips is also a BEOL process.

U.S. Pat. No. 6,348,280 to Hsu et al. issued Mar. 25, 2008, and assigned to the present assignee, discloses a method for fabricating and back-end-of-line (BEOL) metalization structures includes simultaneous high-k and low-k dielectric regions. An interconnect structure includes a first inter-level dielectric (ILD) layer and a second ILD layer with the first ILD layer underlying the second ILD layer. A plurality of columnar air gaps is formed in the first ILD. The columnar air gap structure is created using a two-phase photoresist material for providing different etching selectivity during subsequent processing, such as subsequent reactive ion etching (RIE) processing. To enhance the etching selectivity one phase of the two-phase photoresist material optionally is removed before RIE processing. The two-phase photoresist material includes, for example, two different polymers, or a combination of a polymer and silicon oxide.

A need exists for an effective mechanism for implementing vertical airgap structures between chip metal layers. It is desirable to provide such mechanism for implementing airgaps having the capability to address a total accumulated capacitance associated with a chip-wire signal trace routed on an adjacent mesh layer such as a power delivery mesh because as the length of the signal trace next to a power mesh increases so does the effective capacitance.

SUMMARY OF THE INVENTION

A principal aspect of the present invention is to provide a method and structure for implementing vertical airgap structures between chip metal layers. Other important aspects of the present invention are to provide such method and structure substantially without negative effect and that overcome many of the disadvantages of prior art arrangements.

In brief, a method and structure are provided for implementing vertical airgap structures between chip metal layers. A first metal layer is formed. A first layer of silicon dioxide dielectric is deposited onto the first metal layer. A vertical air gap is etched from the first layer of silicon dioxide dielectric above the first metal layer. A second layer of silicon dioxide dielectric is deposited and the vertical air gap is sealed. A next trace layer of metal is etched from the second layer of silicon dioxide dielectric and a via opening is etched from the second and first layers of silicon dioxide dielectric. Then the next metal trace layer and via is deposited.

In accordance with features of the invention, the vertical air gap is etched into the first layer of silicon dioxide dielectric using conventional etching as used for the via opening.

In accordance with features of the invention, the vertical air gap is vacuum sealed with the deposition of the second layer of silicon dioxide dielectric using conventional processing.

In accordance with features of the invention, the vertical air gap is etched to a selected area into the first layer of silicon dioxide dielectric, the vertical air gap having a set height and a set width. The vertical air gap optionally is etched so that it does not extend all the way through the first layer of silicon dioxide dielectric.

In accordance with features of the invention, the vertical air gap optionally is filled with a sacrificial polymer and a thin porous cap is applied over the vertical air gap and the first layer of silicon dioxide dielectric. Heat is applied to evaporate the sacrificial polymer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, fabrication methods are provided for fabricating vertical airgap structures between chip metal layers for use with various semiconductor and integrated circuits devices.

In accordance with features of the invention, vertical airgap structures are provided between chip metal layers having a wide width, for example, a set width substantially equal to the width of adjacent metal signal traces, and a short height, for example, a set height substantially less than a thickness of a silicon dioxide $SiO_2$ dielectric layer between metal layers.

Figure 1:
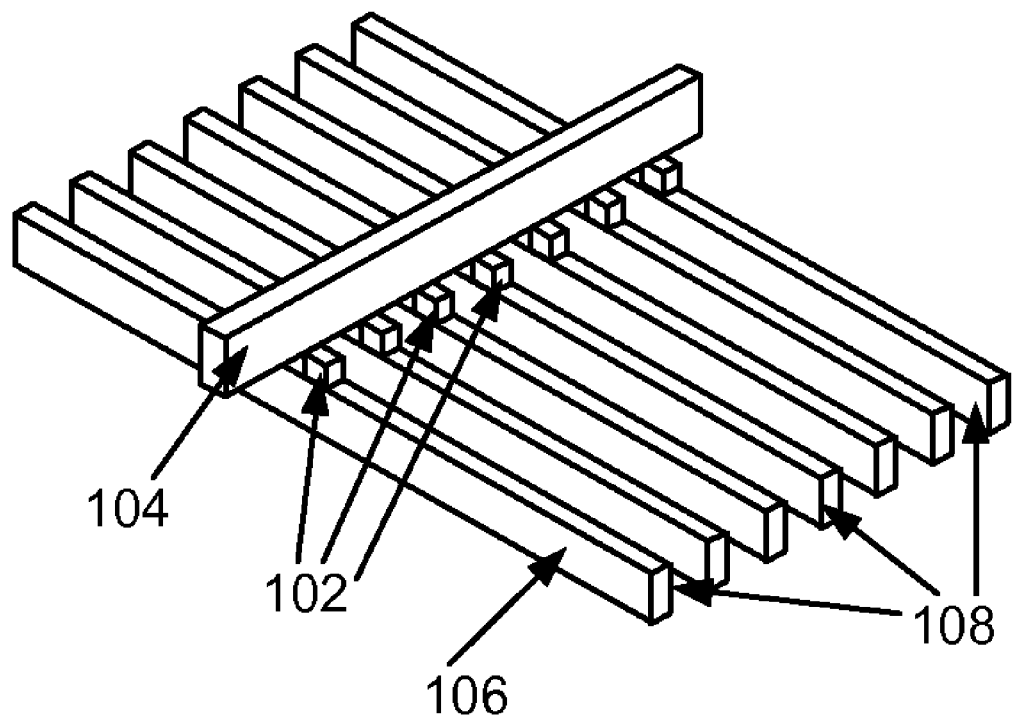
FIG. 1 is a diagram not to scale schematically illustrating an example metallization structure including a plurality of vertical airgap structures between adjacent metal layers in accordance with the preferred embodiment.

Having reference now to the drawings, in FIG. 1, there is shown an example metallization structure generally designated by the reference character 100 including a plurality of vertical airgap structures 102 between adjacent metal layers 104 and 106 in accordance with the preferred embodiment. The lower metal layer 106 includes a plurality of signal traces or metal rails 108. The vertical airgap structures 102 are wide, shallow structures having a width substantially equal to the width of the metal rails 108, and a height substantially less than the height of metal layer 104.

As shown in FIG. 1, in the metallization structure 100 the vertical airgap structures 102 advantageously are placed at the junctions where signal traces of concern, such as metal rails 108 are wired on an adjacent plane to a power mesh or densely wired area of metal layer. The vertical airgap structures 102 lower the effective relative dielectric constant between metal layers 104, 106, for example, resulting in a reduction of capacitance between the trace and the reference plane mesh, where capacitance is directly proportional to the dielectric constant.

In accordance with features of the invention, by reducing the airgap length to half the distance between the metal layers can still reduce capacitance to adjacent layers by over 8%. Table 1 shows an example test value of the total capacitance of a single trace of a certain length between two densely wired layers and then example capacitance value changes when introducing airgaps. Cases where the airgap extends completely from one metal layer to the next and where the airgap is only half the $SiO_2$ thickness were both examined.

TABLE 1

Capacitance of a trace between densely wired layers.

| | |
|---|---|
| No vertical airgaps | 235 fF |
| Full-length vertical airgaps | 211 fF (−10.2%) |
| Half-length vertical airgaps | 215 fF (−8.5%) |

In accordance with features of the invention, benefits from such reduction of trace capacitance with the vertical airgap include decreased propagation delay of signals, improved chip timing margins, reduced dielectric attenuation at high frequencies, and when used along with same-layer airgaps, additional tighter coupling within a differential pair is achieved.

FIGS. 2A, 2B, 2C, 2D, and 2E, there are shown exemplary process steps for fabricating vertical airgap structures between chip metal layers in accordance with the preferred embodiment.

Figure 2A:
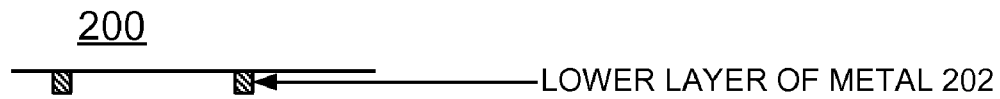
FIGS. 2A, 2B, 2C, 2D, and 2E are diagrams not to scale illustrate exemplary process steps for fabricating vertical airgap structures between chip metal layers in accordance with the preferred embodiment.

In FIG. 2A, a first processing step generally designated by the reference character 200 begins with a metal layer 202 being created.

Figure 2B:
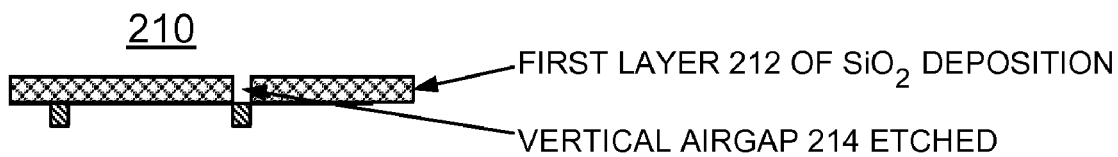

In FIG. 2B, a next processing step generally designated by the reference character 210 begins with a first layer 212 of silicon dioxide $SiO_2$ dielectric deposited on the metal layer 202. Then a vertical air gap 214 is etched into the first layer 214 of silicon dioxide $SiO_2$ dielectric using conventional etching as used for etching a via opening. The first layer 212 has a selected thickness to allow a complete airgap pinch-off to occur in the subsequent $SiO_2$ deposition of the second layer.

As shown in FIG. 2B, the vertical air gap 214 is etched in a selected area of the first layer 212 of silicon dioxide dielectric. The vertical air gap 214 has a set height and a set width. For example, the vertical air gap optionally is etched substantially through the first layer 212 of silicon dioxide dielectric, as shown in FIG. 2B. The vertical air gap 214 optionally is etched so that it does not extend all the way through the first layer 212 of silicon dioxide $SiO_2$ dielectric. For example, the vertical air gap 214 has a height of approximately one half of a thickness of the first layer 212 of silicon dioxide dielectric.

Figure 2C:
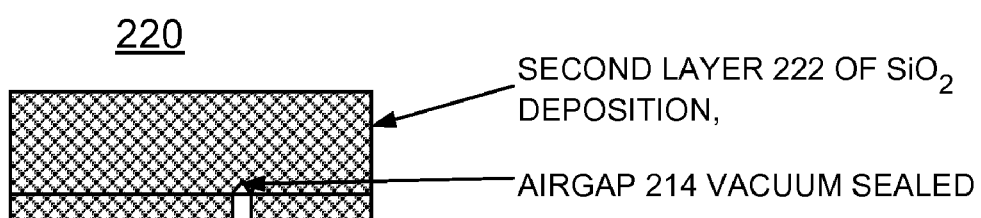

In FIG. 2C, a next processing step generally designated by the reference character 220 begins with second layer 222 of silicon dioxide $SiO_2$ dielectric deposited on the first layer 212 of silicon dioxide dielectric and the airgap 214. In accordance with features of the invention, the vertical air gap 214 is vacuum sealed with the deposition of the second layer 222 of silicon dioxide dielectric using conventional processing. The second $SiO_2$ deposition layer 222 is added to meet the total layer thickness requirement. During this deposition process, the airgap 214 is pinched-off and isolated from future manufacturing processes, preventing any metal from entering the airgap 214 and ensuring that the next metal deposition does not short to the metal layer below it.

Figure 2D:
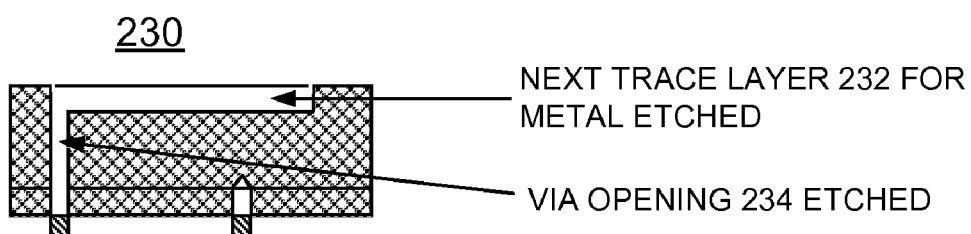

In FIG. 2D, a next processing step generally designated by the reference character 230 begins with a next trace layer 232 being etched in the second layer 222 of silicon dioxide dielectric and a via opening 234 is etched through the first and second layers 212, 222 of the silicon dioxide dielectric.

Figure 2E:
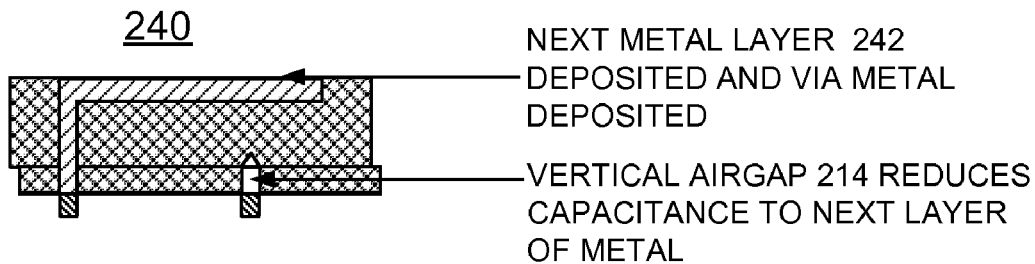

In FIG. 2E, a next processing step generally designated by the reference character 240 begins with a metal layer 242 being created with metal deposited in the trace layer 232 in the second layer 222 of silicon dioxide dielectric and metal deposited and filling the via opening 234.

As shown in FIG. 2E, the vertical air gap 214 reduces capacitance to the next layer of metal.

FIGS. 3A, 3B, 3C, 3D, 3E, and 3F, there are shown exemplary process steps for fabricating vertical airgap structures between chip metal layers in accordance with the preferred embodiment.

In accordance with features of the invention, the vertical air gap optionally is filled with a sacrificial polymer and a thin porous cap is applied over the vertical air gap and the first layer of silicon dioxide dielectric. Heat is applied to evaporate the sacrificial polymer.

Figure 3A:
FIGS. 3A, 3B, 3C, 3D, 3E, and 3F are diagrams not to scale illustrate further exemplary process steps for fabricating vertical airgap structures between chip metal layers in accordance with the preferred embodiment.

In FIG. 3A, a first processing step generally designated by the reference character 300 begins with a metal layer 303 being created.

Figure 3B:

In FIG. 3B, a next processing step generally designated by the reference character 310 begins with a first layer 312 of silicon dioxide dielectric deposited on the metal layer 302. Then a vertical air gap 314 is etched into the first layer 312 of silicon dioxide dielectric using conventional etching as used for a via opening.

As shown in FIG. 3B, the vertical air gap 314 is etched in a selected area of the first layer 312 of silicon dioxide dielectric. The vertical air gap 314 has a set height and a set width. For example, the vertical air gap optionally has a width substantially equal to a width of a signal trace of the metal layer 302. The vertical air gap 314 optionally is etched substantially through the first layer 312 of silicon dioxide dielectric. The vertical air gap 314 optionally is etched so that it does not extend all the way through the first layer of silicon dioxide dielectric. For example, the vertical air gap 314 has a height of approximately one half of a thickness of the first layer of silicon dioxide dielectric, as shown in FIG. 3B. This height for the vertical air gap 314 ensures that the vertical airgap 314 does not interfere with the metal layer 302 and isolates itself from potential existing airgaps on either side of the signal trace of the metal layer 302.

Figure 3C:
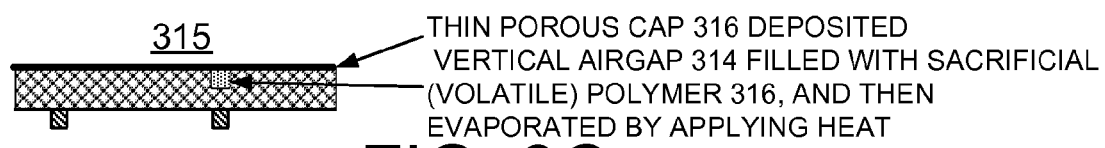

In FIG. 3C, a next optional processing step generally designated by the reference character 315 begins with a thin porous cap 316 being deposited second layer 333 of silicon dioxide dielectric is deposited on the first layer 312 of silicon dioxide dielectric and the airgap 314.

Figure 3D:
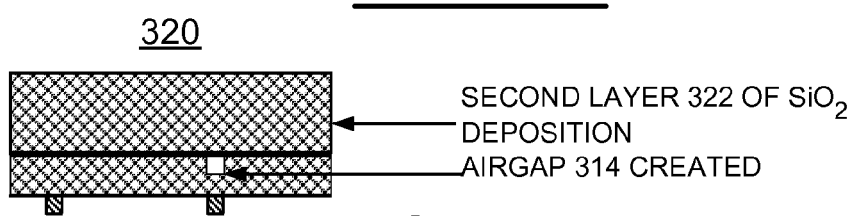

In FIG. 3D, a next processing step generally designated by the reference character 320 begins with second layer 322 of silicon dioxide dielectric is deposited on the thin porous cap 316 covering the first layer 312 of silicon dioxide dielectric and the airgap 314.

Figure 3E:
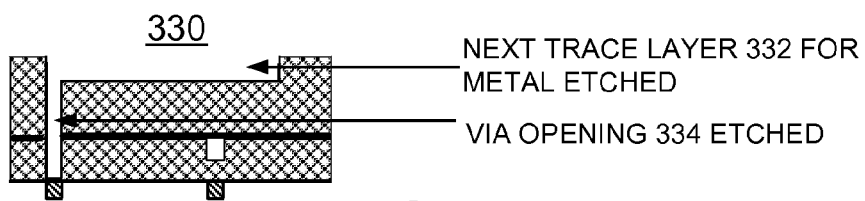

In FIG. 3E, a next processing step generally designated by the reference character 330 begins with a next trace layer 332 being etched in the second layer 322 of silicon dioxide dielectric and a via opening 334 is etched through the first and second layers 312, 322 of the silicon dioxide dielectric.

Figure 3F:
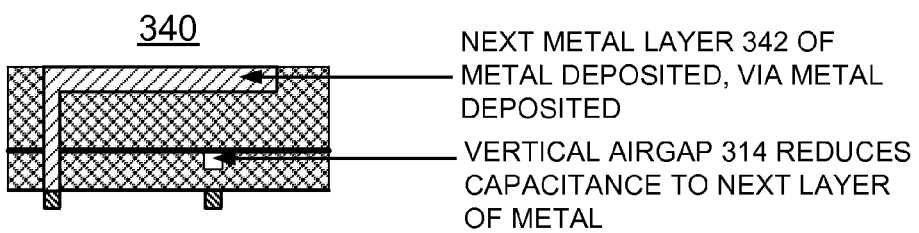

In FIG. 3F, a next processing step generally designated by the reference character 340 begins with a metal layer 342 being created with metal deposited in the trace layer 332 in the second layer 322 of silicon dioxide dielectric and metal deposited and filling the via opening 334.

As shown in FIG. 3F, the vertical air gap 314 reduces capacitance to the next layer of metal.

In accordance with features of the invention, benefits result from the vertical airgaps 214, 314. There is generally less impact on the wire's maximum current ($I_{RMS}$) value due to self heating than conventional co-planar airgap arrangements. This is because the vertical gaps 214, 314 of the invention advantageously are only placed at junctions between adjacent layers where the field lines density is the highest rather than along the entire length of the wire, thereby reducing the overall surface area of thermally insulative airgaps. There is generally less impact on chip reliability due to structural stresses from the vertical gaps 214, 314 of the invention also due to the total volume of airgaps being reduced to where there is maximum benefit.

While the present invention has been described with reference to the details of the embodiments of the invention shown in the drawing, these details are not intended to limit the scope of the invention as claimed in the appended claims.

What is claimed is:

1. A method for implementing vertical airgap structures between chip metal layers comprising the steps of:
    forming a first metal layer;
    depositing a first layer of silicon dioxide dielectric onto said first metal layer;
    etching a vertical air gap from said first layer of silicon dioxide dielectric above said first metal layer; said etched vertical air gap having a set width substantially equal to a width of a metal signal trace of said first metal layer;
    depositing a second layer of silicon dioxide dielectric and sealing said vertical air gap;
    etching a next trace layer from said second layer of silicon dioxide dielectric and etching a via opening through said second and first layers of silicon dioxide dielectric; and
    depositing a second metal layer in said etched next trace layer and depositing metal into said via opening; said etched vertical air gap having a set height substantially less than to a distance between said first metal layer and said second metal layer.

2. The method for implementing vertical airgap structures as recited in claim 1 wherein etching said vertical air gap from said first layer of silicon dioxide dielectric above said first metal layer includes etching a selected area into the first layer of silicon dioxide dielectric, said vertical air gap having said set height and said set width.

3. The method for implementing vertical airgap structures as recited in claim 1 wherein etching said vertical air gap from said first layer of silicon dioxide dielectric above said first metal layer includes etching said vertical air gap having said set height substantially equal to a thickness of said first layer of silicon dioxide dielectric.

4. The method for implementing vertical airgap structures as recited in claim 1 wherein etching said vertical air gap from said first layer of silicon dioxide dielectric above said first metal layer includes etching said vertical air gap having said set height of approximately one half of a thickness of the first layer of silicon dioxide dielectric.

5. The method for implementing vertical airgap structures as recited in claim 1 wherein etching said vertical air gap from said first layer of silicon dioxide dielectric above said first metal layer includes conventional etching as used for a via opening.

6. The method for implementing vertical airgap structures as recited in claim 1 wherein depositing said second layer of silicon dioxide dielectric and sealing said vertical air gap includes vacuum sealing said vertical air gap with depositing said second layer of silicon dioxide dielectric.

7. The method for implementing vertical airgap structures as recited in claim 1 wherein etching said vertical air gap from said first layer of silicon dioxide dielectric above said first metal layer includes filling said vertical air gap with a sacrificial polymer.

8. The method for implementing vertical airgap structures as recited in claim 7 includes applying a thin porous cap over said filled vertical air gap and said first layer of silicon dioxide dielectric.

9. The method for implementing vertical airgap structures as recited in claim 8 includes applying heat to evaporate said sacrificial polymer from said filled vertical air gap through said thin porous cap.

10. The method for implementing vertical airgap structures as recited in claim 8 wherein etching said via opening through said second and first layers of silicon dioxide dielectric includes etching said via opening through said thin porous cap.

11. A structure for implementing vertical airgap structures between chip metal layers comprising:
    a first metal layer;
    a first layer of silicon dioxide dielectric disposed on said first metal layer;
    a vertical air gap formed in said first layer of silicon dioxide dielectric above said first metal layer; said vertical air gap having a set width substantially equal to a width of a metal signal trace of said first metal layer;
    a second layer of silicon dioxide dielectric disposed on said first layer of silicon dioxide dielectric and said vertical air gap;
    a next metal layer formed in said second layer of silicon dioxide dielectric and a metal via extending through said second and first layers of silicon dioxide dielectric between said first and second metal layers; said vertical air gap having a set height substantially less than to a distance between said first metal layer and said second metal layer.

12. The structure for implementing vertical airgap structures between chip metal layers as recited in claim 11 wherein said vertical air gap includes a selected area etched into the first layer of silicon dioxide dielectric, said vertical air gap having said set height and said set width.

13. The structure for implementing vertical airgap structures between chip metal layers as recited in claim 11 wherein said vertical air gap has said set height substantially equal to a thickness of said first layer of silicon dioxide dielectric.

14. The structure for implementing vertical airgap structures between chip metal layers as recited in claim 11 wherein said vertical air gap has said set height of approximately one half of a thickness of the first layer of silicon dioxide dielectric.

15. The structure for implementing vertical airgap structures between chip metal layers as recited in claim 11 wherein said vertical air gap is filled with a sacrificial polymer.

16. The structure for implementing vertical airgap structures between chip metal layers as recited in claim 15 includes a thin porous cap extending over said filled vertical air gap and said first layer of silicon dioxide dielectric.

17. The structure for implementing vertical airgap structures between chip metal layers as recited in claim 16 wherein said sacrificial polymer is evaporated from said filled vertical air gap through said thin porous cap by applying heat.

18. The structure for implementing vertical airgap structures between chip metal layers as recited in claim 11 wherein said vertical air gap is vacuum sealed with deposition of said second layer of silicon dioxide dielectric.

* * * * *